United States Patent
Kodama et al.

(10) Patent No.: US 7,718,258 B2
(45) Date of Patent: May 18, 2010

(54) FILM ADHESIVE AND SEMICONDUCTOR PACKAGE USING THE SAME

(75) Inventors: Youichi Kodama, Sodegaura (JP); Seiji Itami, Mobara (JP); Kuniaki Sato, Sodegaura (JP); Syuji Tahara, Sodegaura (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 1097 days.

(21) Appl. No.: 11/271,943

(22) Filed: Nov. 14, 2005

(65) Prior Publication Data

US 2006/0110595 A1 May 25, 2006

(30) Foreign Application Priority Data

Nov. 12, 2004 (JP) .............................. 2004-329030

(51) Int. Cl.
*B32B 7/12* (2006.01)
(52) U.S. Cl. ............. 428/354; 428/355 R; 428/355 AC
(58) Field of Classification Search .............. 428/474.4, 428/354, 355 R, 355 AC; 528/353
See application file for complete search history.

(56) References Cited

U.S. PATENT DOCUMENTS

| 5,773,509 | A | 6/1998 | Yoshida et al. |
| 6,489,013 | B2 * | 12/2002 | Nagai et al. ................. 428/209 |
| 6,744,133 | B2 | 6/2004 | Tanabe et al. |
| 6,808,819 | B2 | 10/2004 | Ichiroku et al. |
| 2003/0212245 | A1 | 11/2003 | Tokuhisa et al. |
| 2004/0213994 | A1 | 10/2004 | Kozakai et al. |
| 2006/0281872 | A1 * | 12/2006 | Kodama et al. ............. 525/432 |

FOREIGN PATENT DOCUMENTS

| EP | 1 266 926 A1 | 12/2002 |
| EP | 1 624 038 A1 | 2/2006 |
| JP | 09-001723 A | 1/1997 |
| JP | 2002-158239 A | 5/2002 |
| JP | 2003-261834 | 9/2003 |
| JP | 2004-059859 A | 2/2004 |
| JP | 2004-266138 A | 9/2004 |
| KR | 2004-0093009 A | 11/2004 |
| WO | WO 97/03461 A1 | 1/1997 |
| WO | WO 03/102049 A1 | 12/2003 |
| WO | WO 2004/0111148 A | 12/2004 |

OTHER PUBLICATIONS

Written Opinion and Search Report issued Sep. 12, 2006 in corresponding Singapore Patent Application No. 200506988-5.

* cited by examiner

*Primary Examiner*—Thao T. Tran
(74) *Attorney, Agent, or Firm*—Buchanan Ingersoll & Rooney PC

(57) ABSTRACT

A film adhesive having an adhesive layer (C) mainly containing a thermoplastic polyimide having a glass transition temperature of not more than 100° C. and an adhesive layer (D) having a storage shear modulus of not more than $10^6$ Pa at 50° C. Furthermore, the film adhesive further comprises a base material (A) and an adhesive layer (B). The film adhesive can exhibit excellent low-temperature adhesive property and covering capability functioning as a die bonding adhesive film which can be used in a semiconductor package. In addition, the film adhesive can exhibit excellent low-temperature adhesive property and covering capability which functions both as a die bonding adhesive film and as a dicing tape.

12 Claims, No Drawings

FILM ADHESIVE AND SEMICONDUCTOR PACKAGE USING THE SAME

TECHNICAL FIELD

The present invention relates to a film adhesive. More particularly, the invention relates to a film adhesive having a function of a die bonding adhesive film which can be properly used in a semiconductor package, and a film adhesive having both a function of a die bonding adhesive film and a function of a dicing tape in a package assembly process.

BACKGROUND ART

A step of manufacturing a semiconductor package using a film adhesive generally comprises (1) a step of adhering a film adhesive to a back surface of a large diameter wafer; (2) a step of adhering a dicing tape to the side of the film adhesive; (3) a step of dicing a chip; (4) a step of picking up the diced chip from the dicing tape; (5) a step of performing die bonding to an adherend such as a substrate via the film adhesive; (6) a step of performing wire bonding between the chip and the substrate; and (7) a step of molding using a sealing agent.

The film adhesive functions as a die bonding adhesive film, which is adhered to the wafer in the above first step, and adhered to the substrate in the above fifth step. Turning to adhesion to the wafer, in recent years, wafers have been thinned. When the film adhesive has been attached to the wafer at a high temperature, there has occurred a problem in that the wafer might be warped. So, such a film adhesive has been required to have a much excellent low-temperature adhesive property. On the other hand, turning to adhesion to the substrate, in recent years, the number of laminated chips in a package has been increased so that the temperature for wire bonding to a chip has been getting higher and the time required for wire bonding to the chip has been getting longer. The conventional film adhesive has been cured during wire bonding so that there has occurred a problem of a bad covering for the unevenness on the surface of the substrate. Accordingly, in order to secure reliability, a film adhesive has been required to have a much superior covering property for the unevenness on a surface of the substrate even under much stricter wire bonding conditions.

Furthermore, for the purpose of simplified process, in recent years, a dicing and die bonding adhesive film combining a function as a die bonding adhesive film and a function as a dicing tape has been in demand (refer to Patent Documents 1 and 2). Thus, in the above-mentioned steps, steps (1) and (2) can be performed at the same time.

However, the present situation is that a dicing and die bonding adhesive film having the excellent low-temperature adhesive property and covering capability has not yet been developed.

[Patent Document 1] JP2004-83602A
[Patent Document 2] JP2004-95844A

DISCLOSURE OF THE INVENTION

Under the above circumstances, an object of the present invention is to provide a film adhesive with the excellent low-temperature adhesive property and covering capability having a function of a die bonding adhesive film which can be properly used in a semiconductor package, and a film adhesive having both a function of a die bonding adhesive film and a function of a dicing tape in a package assembly process.

The present inventors have conducted an extensive study. Thus, the present invention has been completed.

That is, the first invention relates to a film adhesive comprising an adhesive layer (C) mainly containing a thermoplastic polyimide having a glass transition temperature of not more than 100° C. and an adhesive layer (D) having a storage shear modulus of not more than $10^6$ Pa at 50° C.

Furthermore, the aforementioned film adhesive further comprising a base material (A) and an adhesive layer (B) is a preferred embodiment as it is possible to give a function as a dicing tape.

The aforementioned base material (A) being a film having an elastic modulus in tension of not more than 500 MPa at 25° C. is a preferred embodiment from the viewpoint of the expandability at the time of pick-up.

The 180° peel strength between the adhesive layer (B) and the adhesive layer (C) of from 0.1 N/25 mm to 2.5 N/25 mm is a preferred embodiment from the viewpoint of the pick up property.

The aforementioned adhesive layer (C) comprising a resin composition containing a thermosetting resin and a filler in addition to polyimide is a preferred embodiment from the viewpoint of the heat resistance.

The aforementioned polyimide being a polyimide obtained by reacting a diamine component containing a diamine having a chained polyether in a molecule with a tetracarboxylic dianhydride component is a preferred embodiment from the viewpoint of the low-temperature adhesive property.

The aforementioned polyimide being a polyimide obtained by reacting a diamine component containing a diamine having at least one phenolic hydroxyl group in a molecule and a diamine having a chained polyether in a molecule with a tetracarboxylic dianhydride component, and having a glass transition temperature of from 40° C. to 100° C. is a preferred embodiment from the viewpoint of the low-temperature adhesive property.

The second invention relates to a film adhesive comprising a polyimide having a glass transition temperature of not more than 100° C., and comprising at least one layer of an adhesive layer (C') having a storage shear modulus of not more than $5.0 \times 10^6$ Pa when it is maintained at a temperature of 180° C. for an hour.

The aforementioned adhesive layer (C') being composed of a resin composition comprising a thermoplastic polyimide obtained by reacting a diamine component containing a diamine having a chained polyether in a molecule with a tetracarboxylic dianhydride component, and a thermosetting resin as essential components is a preferred embodiment from the viewpoints of the low-temperature adhesive property and heat resistance.

The aforementioned adhesive layer (C') being composed of a resin composition comprising a thermoplastic polyimide obtained by reacting a diamine component containing a diamine having at least one phenolic hydroxyl group in a molecule and a diamine having a chained polyether in a molecule with a tetracarboxylic dianhydride component, and having a glass transition temperature of from 40° C. to 100° C., and a thermosetting resin as essential components is a preferred embodiment from the viewpoints of the low-temperature adhesive property and heat resistance.

The third invention relates to a semiconductor package manufactured by using the aforementioned film adhesive.

EFFECT OF THE INVENTION

The film adhesive according to the present invention has a function as a die bonding adhesive film which can be properly used in a semiconductor package, which is excellent in the low-temperature adhesive property and the covering capability for the unevenness on a surface of a substrate. Furthermore, it has also a function as a dicing tape in a package assembly process, whereby the process can be simplified.

BEST MODE FOR CARRYING OUT THE INVENTION

The film adhesive according to the present invention comprises an adhesive layer (C) and an adhesive layer (D) or an adhesive layer (C'), each functioning as a die bonding adhesive film in a semiconductor package. The film adhesive preferably comprises a supporting base material (A) and an adhesive layer (B), each functioning as a dicing tape, and an adhesive layer (C') functioning as a die bonding adhesive film in a semiconductor package which are laminated in the order of (A)/(B)/(C'). The film adhesive comprises more preferably composed of a supporting base material (A) and an adhesive layer (B), each functioning as a dicing tape, and an adhesive layer (C) and an adhesive layer (D), each functioning as a die bonding adhesive film in a semiconductor package which are laminated in the order of (A)/(B)/(C)/(D).

The quality of the supporting base material (A) and the adhesive layer (B), each functioning as a dicing tape, is not particularly restricted. Any of UV type or non-UV type (pressure sensitive type) materials may be good as far as they cause no defect at the time of dicing and they can be easily peeled away at the time of pick-up. The elastic modulus in tension of the supporting base material (A) is preferably not more than 500 MPa and more preferably not more than 400 MPa at 25° C. from the viewpoint of the expandability at the time of pick-up.

Concrete examples of the supporting base material (A) include polyolefins such as polyethylene, polypropylene, polyvinyl chloride and the like.

Concrete examples of the adhesive (B) include polyolefin-based adhesive and acryl-based adhesive.

As commercial UV type materials, there can be exemplified UHP series manufactured by Denki Kagaku Kogyo Kabushiki Kaisha, UC series manufactured by The Furukawa Electric Co., Ltd. and the like. As non-UV type materials, there can be exemplified MPF series manufactured by Mitsui Chemicals, Inc. and the like.

A thickness of the base material (A) or the adhesive layer (B) is not particularly restricted. The thickness of the base material (A) is preferably from about 50 µm to 150 µm while the thickness of the adhesive layer (B) is preferably from about 5 µm to 20 µm from the viewpoint of handling.

The quality of the adhesive layer (C'), the adhesive layer (C) and the adhesive layer (D), each functioning as a die bonding adhesive film in a semiconductor package, is not particularly restricted, which may be good if defects such as blister, peeling and the like do not occur in a reflow process at a temperature of not less than 250° C. in a process of manufacturing a semiconductor package.

The adhesive layer (C) and the adhesive layer (C') mainly comprise a thermoplastic polyimide. The glass transition temperature of the polyimide is preferably not more than 100° C., and more preferably from 40° C. to 80° C. from the viewpoint of the low-temperature adhesive property.

The adhesive layer (C) and the adhesive layer (C') more preferably comprises a thermosetting resin and a filler from the viewpoint of the heat resistance.

The thermoplastic polyimide is preferably a polyimide obtained by reacting a diamine component containing a diamine having a chained polyether in a molecule with a tetracarboxylic dianhydride from the viewpoint of the low-temperature adhesive property.

Concrete examples of the diamine having a chained polyether in a molecule include, though not restricted to, polytetramethyleneoxide-di-o-aminobenzoate, polytetramethyleneoxide-di-m-aminobenzoate, polytetramethyleneoxide-di-p-aminobenzoate, polytrimethyleneoxide-di-o-aminobenzoate, polytrimethyleneoxide-di-m-aminobenzoate, polytrimethyleneoxide-di-p-aminobenzoate and the like. Preferable is polytetramethyleneoxide-di-p-aminobenzoate.

The amount of the diamine having a chained polyether in a molecule contained in the whole diamine component is preferably from 10 mole % to 90 mole %. When the amount is less than 10 mole %, the glass transition temperature becomes high; therefore, such an amount may not be preferable. When the amount is more than 90 mole %, the glass transition temperature is too lowered; therefore, such an amount may not be preferable either.

Furthermore, from the viewpoint of the adhesive property, the diamine having at least one phenolic hydroxyl group in a molecule is more preferably contained in the diamine component.

The diamine having a phenolic hydroxyl group can be used without any particular restriction, whereas diamines represented by the general formulae (1) to (3) are preferable.

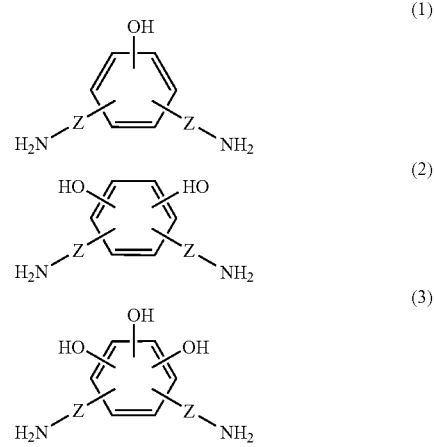

wherein Z are each independently a direct bonding or a divalent organic group.

As the divalent organic group of Z, there can be exemplified an aliphatic group, an alicyclic group, a monocyclic aromatic group, a condensed polycyclic aromatic group, a non-condensed cyclic aromatic group in which aromatic groups are directly bonding or bonding to each other via a crosslinking source, and the like, each having 2 to 27 carbon atoms.

Concrete examples of diamines represented by the general formulae (1) to (3) include 2,3-diaminophenol, 2,4-diaminophenol, 2,5-diaminophenol, 2,6-diaminophenol, 3,4-diaminophenol, 3,5-diaminophenol, 3,6-diaminophenol, 4,5-diaminophenol, 4,6-diaminophenol, 3,3'-diamino-4,4'-dihydroxybiphenyl, 4,4'-diamino-3,3'-dihydroxybiphenyl, 4,4'-diamino-2,2'-dihydroxybiphenyl, 4,4'-diamino-2,2',5,5'-tetrahydroxybiphenyl, 3,3'-diamino-4,4'-dihydroxydiphenylmethane, 4,4'-diamino-3,3'-dihydroxydiphenylmethane, 4,4'-diamino-2,2'-dihydroxydiphenylmethane, 4,4'-diamino-2,2',5,5'-tetrahydroxydiphenylmethane, 2,2-bis[3-amino-4-hydroxyphenyl]propane, 2,2-bis[4-amino-3-hydroxyphenyl] propane and the like.

The amount of the diamine having a phenolic hydroxyl group is preferably from 0.1 mole % to 10 mole % and more preferably from 1 mole % to 5 mole % in the whole diamine component. When the amount is less than 0.1 mole %, heat resistant performance may be not sufficiently obtained. On the other hand, when the amount is more than 10 mole %, the low-temperature adhesive performance tends to be deteriorated.

As diamines other than a diamine having a chained polyether in a molecule or a diamine having at least one phenolic hydroxyl group in a molecule which can be used for the present invention, any diamine can be used without any particular restriction as far as the glass transition of the polyimide is not more than 100° C. when the diamine makes into a polyimide. Examples thereof include m-phenylene diamine, o-phenylene diamine, p-phenylene diamine, bis(3-aminophenyl)sulfide, bis(4-aminophenyl)sulfide, bis(3-aminophenyl)sulfoxide, bis(4-aminophenyl)sulfoxide, bis(3-aminophenyl)sulfone, bis(4-aminophenyl)sulfone, 2,2-bis[4-(3-aminophenoxy)phenyl]butane, 1,1,3,3-tetramethyl-1,3-bis(3-aminopropyl)disiloxane, 1,1,3,3-tetraphenyl-1,3-bis(3-aminopropyl)disiloxane, 1,3-bis(3-aminophenoxy) benzene, polytetramethyleneoxide-di-o-aminobenzoate, polytetramethyleneoxide-di-m-aminobenzoate, polytetramethyleneoxide-di-p-aminobenzoate, polytrimethyleneoxide-di-o-aminobenzoate, polytrimethyleneoxide-di-m-aminobenzoate, polytrimethyleneoxide-di-p-aminobenzoate and the like.

Similarly, as the tetracarboxylic dianhydride component which can be used for the present invention, any tetracarboxylic dianhydride can be used without any particular restriction as far as the glass transition of the polyimide is not more than 100° C. when the tetracarboxylic dianhydride makes into a polyimide. Examples thereof include pyromellitic dianhydride, 3,3',4,4'-benzophenontetracarboxylic dianhydride, 3,3',4,4'-biphenyltetracarboxylic dianhydride, oxy-4,4'-diphthalic dianhydride, ethylene glycol bistrimellitic dianhydride, 2,2-bis(4-(3,4-dicarboxyphenoxy)phenyl)propane dianhydride, α,ω-polydimethylsiloxane tetracarboxylic dianhydride, α,ω-bis(3,4-dicarboxyphenyl)polydimethylsiloxane dianhydride and the like.

As a method for producing polyimide, any methods capable of producing polyimide can be applied, including known methods. Of these methods, it is preferable to carry out a reaction in an organic solvent. As a solvent which can be used in this reaction, there can be exemplified N,N-dimethylacetamide, N-methyl-2-pyrrolidone, toluene, xylene, mesitylene, phenol, cresol and the like.

Meanwhile, the concentration of the reaction raw material in a solvent in this reaction is usually from 2 weight % to 50 weight % and preferably from 5 weight % to 40 weight %, while the reaction molar ratio of the tetracarboxylic dianhydride component to the diamine component is preferably in the range of 0.8 to 1.2 (tetracarboxylic dianhydride component/diamine component). Within this range, the heat resistance is preferably never deteriorated.

The reaction temperature for the synthesis of a precursor of polyimide, i.e., a polyamic acid, is usually not more than 60° C., and preferably from 10° C. to 50° C. The reaction pressure is not particularly restricted and the reaction can be sufficiently carried out at an atmospheric pressure. Furthermore, the time required for the reaction is different depending on the type of the reaction raw material, the type of the solvent and the reaction temperature, but it is usually from half an hour to 24 hours, which is enough for the reaction. According to the present invention, a polyimide is obtained, which has a repeating unit structure corresponding to the polyamic acid by imidizing the thus-obtained polyamic acid by heating at from 100° C. to 400° C. or chemically imidizing it by using an imidizing agent such as an acetic anhydride or the like.

Furthermore, by carrying out the reaction at from 130° C. to 250° C., generation of the polyamic acid and a thermal imidization reaction are carried out at the same time, whereby polyimide according to the present invention can be obtained. Namely, the diamine component and the tetracarboxylic dianhydride are subjected to suspension or dissolution in an organic solvent for carrying out the reaction by heating at a temperature of from 130° C. to 250° C. and carrying out generation of a polyamic acid and dehydration imidization at the same time, whereby polyimide according to the present invention can be obtained.

The molecular weight of polyimide according to the present invention is not particularly restricted and arbitrary molecular weights can be used according to usage or processing method. For polyimide according to the present invention, for example, the value of logarithmic viscosity number measured at 35° C. after dissolving polyimide in N-methyl-2-pyrrolidone at a concentration of 0.5 g/dl can be any value ranging from 0.1 dl/g to 3.0 dl/g by controlling the ratio of the diamine component to the tetracarboxylic dianhydride in use.

In the present invention, an expression of polyimide includes a resin partly coexisting with its precursor, i.e., a polyamic acid, in addition to 100% imidized polyimide.

Further, a polyimide solution obtained by the above reaction may be used as it is or the polyimide solution may be fed into a poor solvent for precipitating polyimide.

The quality of the thermosetting resin and the filler is not particularly restricted, but materials are preferably selected such that the storage shear modulus of the adhesive layer (C) or the adhesive layer (C') is not more than $5.0 \times 10^6$ Pa and preferably not more than $3.0 \times 10^6$ Pa at 180° C. when such a layer is maintained at a temperature of 180° C. for an hour from the viewpoint of the covering capability for the unevenness on a surface of a substrate. When the storage shear modulus exceeds $5.0 \times 10^6$ Pa, the covering capability tends to be deteriorated and the heat resistance tends to be worsened.

Concrete examples of the thermosetting resin include glycidyl ether of bisphenol A, bisphenol S and bisphenol F, phenol novolac type epoxy resin, biphenyl type epoxy compound and the like.

The combination amount of the thermosetting resin is from 1 weight part to 200 weight parts and preferably from 1 weight part to 100 weight parts, based on 100 weight parts of the thermoplastic polyimide. If the amount is within this range, the heat resistance can be maintained so that the film-forming ability is excellent.

Furthermore, a curing agent may be combined as required. As the curing agent, there can be exemplified an imidazole type curing agent, a phenol type curing agent, an amine type curing agent, an acid anhydride type curing agent and the like. From the viewpoint of storage stability of the resin composition, a curing agent having heat potential and long pot life is preferable.

The combination amount of the curing agent is preferably in the range of 0 weight part to 20 weight parts, based on 100 weight parts of the thermosetting resin. If the amount is within this range, it is difficult to create gel in the resin solution state so that the storage stability of the resin solution is excellent.

Furthermore, a filler may be combined as required. As the filler, there can be exemplified an organic filler such as an epoxy resin, a melamine resin, a urea resin, a phenol resin or the like, and an inorganic filler such as alumina, aluminum nitride, silica or the like.

The combination amount of the filler is in the range of 0 weight part to 5,000 weight parts and preferably in the range of 0 weight part to 3,000 weight parts, based on 100 weight parts of the thermoplastic polyimide. If the amount is within this range, the filler is hardly precipitated in the resin solution state so that the storage stability of the resin solution is excellent. On the other hand, when the filler is contained too much, the adhesive property may be deteriorated in some cases.

Furthermore, a coupling agent may be added as needed. The coupling agent is not particularly restricted as far as the aim of the present invention is not damaged. The coupling agent is preferably good at solubility into the resin soluble solvent. Examples thereof include a silane type coupling agent, a titanium type coupling agent and the like.

The combination amount of the coupling agent is in the range of 0 weight part to 50 weight parts and preferably in the range of 0 weight part to 30 weight parts, based on 100 weight parts of polyimide. If the amount is within this range, the heat resistance is never deteriorated.

A thickness of the adhesive layer (C) and the adhesive layer (C') is preferably from 5 μm to 100 μm from the viewpoint of the covering capability for the unevenness on a surface of the substrate. When the thickness is less than 5 μm, covering may become insufficient. Even when it is more than 100 μm, the covering capability may be not improved.

The adhesive layer (B) and the adhesive layer (C) or the adhesive layer (C') are preferably adjacent to each other, while the 180° peel strength between them is preferably from 0.1 N/25 mm to 2.5 N/25 mm. When the amount is less than 0.1 N/25 mm, a problem such as chip flying or the like may occur at the time of dicing. When it exceeds 2.5 N/25 mm, pick-up may be not possible at the time of pick-up or crack may occur in a chip in some cases.

The adhesive layer (D) preferably has a storage shear modulus of not more than $1.0 \times 10^6$ Pa and more preferably not more than $1.0 \times 10^5$ Pa at 50° C. When the storage shear modulus exceeds $1.0 \times 10^6$ Pa, low-temperature adhesion tends to be difficult.

By adhering a film adhesive to a silicon wafer via the adhesive layer (D), it is possible to adhere the film adhesive to the silicon wafer at a much lower temperature. So, when the film adhesive is adhered to a thin wafer of not more than 100 μm, wafer warpage can be reduced.

Concrete examples of the adhesive layer (D) include a silicone-based adhesive, an acryl-based adhesive and the like.

A thickness of the adhesive layer (D) is preferably from 1 μm to 10 μm from the viewpoints of adhesion to the silicon wafer and the heat resistance. When the thickness is less than 1 μm, the adhesive strength may be not obtained. When it exceeds 10 μm, the heat resistance tends to be worsened.

A method for producing the film adhesive according to the present invention is not particularly restricted. For example, a solution mainly containing a polyimide resin is coated on a supporting film such as poly ethylene terephthalate (PET) or the like and dried to form an adhesive layer (C) and then an adhesive solution is coated thereon and dried to form an adhesive layer (D). A tape comprising a base material (A) and an adhesive layer (B) which are prepared in advance by extrusion molding is laminated thereon so as for the adhesive layer (B) to contact with the adhesive layer (C).

The die bonding adhesive film part (adhesive layer (C) and adhesive layer (D) or adhesive layer (C')) or a dicing tape part (base material (A)+adhesive layer (B)) are circumferentially cut in advance as needed.

A method for manufacturing a semiconductor package according to the present invention is not particularly restricted. For example, it is generally manufactured as follows: (1) adhering a film adhesive to a back surface of a large diameter wafer via the adhesive layer (D); (2) dicing a chip; (3) picking up the diced chip between the adhesive layer (B) and the adhesive layer (C); (4) performing die bonding to an adherend such as a substrate via the adhesive layer (C); (5) performing wire bonding between the chip and the substrate; and (6) molding using a sealing agent.

EXAMPLES

The present invention is now more specifically illustrated below with reference to Examples. However, the present invention is not limited to these Examples. Meanwhile, various properties described in Examples were measured by the following methods.

(Method for Measuring Storage Shear Modulus)
Device: ARES, manufactured by Rheometrics, Inc.
Mode: Temperature dispersion (warpage control), twist mode
Temperature range: 30° C. to 200° C. (5° C./min.), in a nitrogen atmosphere
Frequency: 1 Hz (Method for Measuring Time-resolved Storage Shear Modulus)
Device: ARES, manufactured by Rheometrics, Inc.
Mode: Time dispersion (warpage control), twist mode
Temperature range: 180° C., 5 hours, in a nitrogen atmosphere
Frequency: 1 Hz (Method for Measuring Elastic Modulus in Tension)
Device: STROGRAPH M-1, manufactured by Toyo Seiki Co., Ltd.
Mode: Tensile mode (Method for Measuring Peel Strength)
Device: STROGRAPH M-1, manufactured by Toyo Seiki Co., Ltd.
Mode: 180° Peel Synthesis Example 1

A 300-ml, 5-necked separable flask was provided with a stirrer, a nitrogen gas inlet tube, a thermometer and a Dienstag tube filled with mesitylene. 18.75 g of polytetramethyleneoxide-di-p-aminobenzoate (product name: ELASMER-1000, average molecular weight: 1,268, manufactured by Ihara Chemical Industry Co., Ltd.), 45.87 g of oxy-4,4'-diphthalic dianhydride, 100 g of N-methyl-2-pyrrolidone and 45 g of mesitylene were measured with the flask. The resulting mixture was dissolved in a nitrogen atmosphere. Thereinto was added 32.00 g of bisaminopropyltetramethyldisiloxane (product name: PAM-E, manufactured by Shin-Etsu Chemical Co., Ltd.) little by little. Then, the nitrogen gas inlet tube was inserted into the solution (in a bubbling state), and the solution was heated at a temperature of from 170° C. to 180° C. in the system with azeotropic removal of water and maintained for 12 hours. After cooling, 145 g of mesitylene was added for diluting and 0.93 g 4,4'-diamino-3,3'-dihydroxybiphenyl (product name: HAB, manufactured by Wakayama Seika Kogyo Co., Ltd.) was added to obtain a solution of a thermoplastic polyimide. The glass transition temperature of the thus-obtained polyimide was 56° C. (peak temperature of Tan δ at the measurement of the elastic modulus in tension).

The polyimide solution was combined with 20 weight parts of an epoxy compound (VG3101, manufactured by Mitsui Chemicals, Inc.) and 40 weight parts of a silica-based filler (1-FX, manufactured by Tatsumori Ltd.) based on 100 weight parts of a solid content of the obtained polyimide. The resultant was sufficiently mixed in a stirrer to obtain a resin composition 1.

Synthesis Example 2

A 300-ml, 5-necked separable flask was provided with a stirrer, a nitrogen gas inlet tube, a thermometer and a Dienstag tube filled with mesitylene. 15.00 g of 1,3-bis(3-(3-aminophenoxy)phenoxy)benzene, 43.44 g of silicone diamine (α,ω-bis(3-aminopropyl)polydimethylsiloxane (BY16-853U, average molecular weight: 920, manufactured by Dow Corning Toray Silicone Co., Ltd.), 110.61 g of N-methyl-2-pyrrolidone and 47.40 g of mesitylene were measured with the flask. The resulting mixture was heated at 50° C. in a nitrogen atmosphere for dissolving. Thereinto were added 18.49 g of oxy-4,4'-diphthalic dianhydride and 8.15 g of ethylene glycol bistrimellitic dianhydride little by little. Then, the nitrogen gas inlet tube was inserted into the solution (in a bubbling state), and the solution was heated at a temperature of from 170° C. to 180° C. in the system with azeotropic removal of water and maintained for 30 hours to avoid bumping. A solution of a thermoplastic polyimide was obtained. The glass transition temperature of the thus-obtained polyimide was 67° C. (peak temperature of Tan δ at the measurement of the elastic modulus in tension).

The polyimide solution was mixed with 20 weight parts of an epoxy compound (VG3101L, manufactured by Mitsui Chemicals, Inc.), 1 weight part of an imidazole type curing agent (2MAOK-PW, manufactured by Shikoku Chemicals Corp.) and 39 weight parts of a silica-based filler (1-FX, manufactured by Tatsumori Ltd.) based on 100 weight parts of a solid content of the obtained polyimide. The resultant was sufficiently mixed in a stirrer to obtain a resin composition 2.

Synthesis Example 3

A 500-ml, 5-necked separable flask was provided with a stirrer, a nitrogen gas inlet tube, a thermometer and a Dienstag tube filled with mesitylene. 13.95 g of polytetramethyleneoxide-di-p-aminobenzoate(product name: ELASMER-1000, manufactured by Ihara Chemical Co., Ltd.), 28.00 g of 1,3-bis(3-aminophenoxy)benzene, 34.12 g of oxy-4,4'-diphthalic dianhydride, 100 g of N-methyl-2-pyrrolidone and 40 g of mesitylene were measured with the flask. The resulting mixture was dissolved in a nitrogen atmosphere. Then, the nitrogen gas inlet tube was inserted into the solution (in a bubbling state), and the solution was heated at a temperature of from 170° C. to 180° C. in the system with azeotropic removal of water and maintained for 12 hours. After cooling, 290 g of N-methyl-2-pyrrolidone was added for diluting and 0.70 g 4,4'-diamino-3,3'-dihydroxybiphenyl (product name: HAB, manufactured by Wakayama Seika Kogyo Co., Ltd.) were added to obtain a solution of a thermoplastic polyimide. The glass transition temperature of the thus-obtained polyimide was 157° C. (peak temperature of Tan δ at the measurement of the elastic modulus in tension).

The polyimide solution was mixed with 5 weight parts of an epoxy compound (VG3101, manufactured by Mitsui Chemicals, Inc.) on 100 weight parts of a solid content of the obtained polyimide. The resultant was sufficiently mixed in a stirrer to obtain a resin composition 3.

Example 1

The resin composition 1 was coated on a surface-treated PET film (A54 having a thickness of 50 μm, manufactured by Teijin Dupont Films Ltd.). The resultant was heated at 100° C. for 30 minutes to obtain an adhesive layer (C) having a thickness of 20 μm. Meanwhile, the storage shear elastic modulus was $0.96 \times 10^6$ Pa while the adhesive layer (C) was maintained at a temperature of 180° C. for an hour.

A solution with 100 weight parts of a silicone resin (SD4560, manufactured by Dow Corning Toray Co., Ltd.) and 0.9 weight part of a platinum catalyst solution (NC-25, manufactured by Dow Corning Toray Co., Ltd.) added thereto was further coated on the adhesive layer (C). The resultant was heated at 100° C. for 5 minutes to form an adhesive layer (D) having a thickness of 5 μm. Furthermore, the storage shear elastic modulus of the adhesive layer (D) was $5.7 \times 10^4$ Pa at 50° C.

The die bonding adhesive film part comprising the adhesive layer (C) and adhesive layer (D) obtained was punched at a size corresponding to an 8 inch wafer. The side of the adhesive layer (C) was laminated with a dicing tape (product name: MPF, non-UV type, thickness: 100 μm, elastic modulus in tension of a supporting base material (A): 400 Mpa, manufactured by Mitsui Chemicals, Inc.) comprising a supporting base material (A) and an adhesive layer (B) via the adhesive layer (B) at 60° C. to obtain a film adhesive of the present invention. Furthermore, the 180° peel strength between the adhesive layer (B) and the adhesive layer (C) was 1 N/25 mm.

A glass wafer and a ring frame were adhered to the adhesive layer (D) of the obtained film adhesive at a room temperature and the resultant was diced at a size of 5 square-mm. However, there were no problems occurred such as infiltration of water, chip flying, burr and the like. Thereafter, although the pick-up (peeling between the adhesive layer (B) and the adhesive layer (C)) was performed, no problems such as pick-up miss and the like were occurred.

The obtained 5 square-mm glass chip die mounted on a 20 square-mm silicone via the adhesive layer (C) was heat-pressed at 100° C. for 10 seconds under 10 MPa and then heat-cured at 180° C. for 3 hours with no load. Although this sample piece was allowed to stand in an oven at 260° C. for 30 minutes, no blister or peeling problem was detected so that the heat resistance (covering capability) was found excellent.

Example 2

A sample piece was prepared and evaluated in the same manner as in Example 1, except that a mixture comprising 100 weight parts of an acryl resin (VAMAC, manufactured by Du Pont-Mitsui Polychemicals Co., Ltd.), 20 weight parts of an epoxy compound (VG3101, manufactured by Mitsui Chemicals, Inc.) and 1 weight part of a curing catalyst (2 MAOK-PW, manufactured by Shikoku Chemicals Corp.) was used instead of the silicone resin and platinum catalyst solution of the adhesive layer (D) in Example 1.

The evaluation results are shown in Table 1.

Example 3

A sample piece was prepared and evaluated in the same manner as in Example 1, except that the resin composition 2 was used instead of the resin composition 1 in Example 1.

The evaluation results are shown in Table 1.

Example 4

A sample piece was prepared and evaluated in the same manner as in Example 1, except that the resin composition 1 was used instead of the silicone resin and platinum catalyst solution of the adhesive layer (D) in Example 1.

The evaluation results are shown in Table 1.

Comparative Example 1

A sample piece was prepared and evaluated in the same manner as in Example 1, except that the resin composition 3 was used instead of the resin composition 1 in Example 1.

The evaluation results are shown in Table 1.

TABLE 1

|  | Example 1 | Example 2 | Example 3 | Example 4 | Comparative Example 1 |
|---|---|---|---|---|---|
| Base material (A) | Polyolefin-based (85 (μm)) | <— | <— | <— | <— |
| Adhesive layer (B) | Polyolefin-based (15 (μm)) | <— | <— | <— | <— |
| Adhesive layer (C) | Resin composition 1 (20 (μm)) | <— | Resin composition 2 (20 (μm)) | Resin composition 1 (20 (μm)) | Resin composition 3 (20 (μm)) |
| Adhesive layer (D) | Silicone-based (5 (μm)) | Acryl-based (5 (μm)) | Silicone-based (5 (μm)) | Resin composition 1 (5 (μm)) | Silicone-based (5 (μm)) |
| Elastic modulus in tension of the base material (A) | 400 MPa | <— | <— | <— | <— |
| Peel strength between the adhesive layer (B) and adhesive layer (C) | 1 N/25 mm | <— | <— | <— | <— |
| Glass transition temperature of a thermoplastic polyimide | 56° C. | <— | 67° C. | 56° C. | 157° C. |
| Storage shear modulus of the adhesive layer (C) when it is maintained at 180° C. for an hour | $0.96 \times 10^6$ Pa | <— | $5.3 \times 10^6$ Pa | $0.96 \times 10^6$ Pa | $2.0 \times 10^6$ Pa |
| Storage shear modulus of the adhesive layer (D) at 50° C. | $5.7 \times 10^4$ Pa | $1.3 \times 10^5$ Pa | $5.7 \times 10^4$ Pa | $1.6 \times 10^6$ Pa | $5.7 \times 10^4$ Pa |
| Wafer laminating property of the adhesive layer (D) | Capable of lamination at room temperature | Capable of lamination at room temperature | Capable of lamination at room temperature | A little difficulty in lamination at room temperature | Capable of lamination at room temperature |
| Die bonding property of the adhesive layer (C) | Good | Good | Good | Good | Difficulty in bonding at 100° C. |
| Dicing property | Good | Good | Good | Good | Good |
| Pick-up property | Good | Good | Good | Good | Good |
| Heat resistance | Good | Good | A little inferior | Good | Good |

INDUSTRIAL APPLICABILITY

The film adhesive of the present invention can be used as a die bonding adhesive film which can be properly used in a semiconductor package, and used both as a die bonding adhesive film and as a dicing tape in a package assembly process. The film adhesive is excellent in the low-temperature adhesive property and the covering capability for the unevenness on the substrate so that the industrial value is high.

The invention claimed is:

1. A film adhesive comprising an adhesive layer (C) mainly containing a thermoplastic polyimide having a glass transition temperature of not more than 100° C. and an adhesive layer (D) having a storage shear modulus of not more than $10^6$ Pa at 50° C., wherein the polyimide is obtained by reacting a diamine component containing a diamine having a chained polyether in a molecule with a tetracarboxylic dianhydride component.

2. The film adhesive according to claim 1, wherein the film adhesive further comprises a base material (A) and an adhesive layer (B).

3. The film adhesive according to claim 2, wherein the base material (A) is a film having an elastic modulus in tension of not more than 500 MPa at 25° C.

4. The film adhesive according to claim 3, wherein the 180° peel strength between the adhesive layer (B) and the adhesive layer (C) is from 0.1 N/25 mm to 2.5 N/25 mm.

5. The film adhesive according to claim 4, wherein the adhesive layer (C) comprises a resin composition containing a thermosetting resin and a filler as essential components in addition to the thermoplastic polyimide.

6. The film adhesive according to claim 5, wherein the polyimide is a polyimide obtained by reacting a diamine component containing a diamine having at least one phenolic hydroxyl group in a molecule and a diamine having a chained polyether in a molecule with a tetracarboxylic dianhydride component, and having a glass transition temperature of from 400° C. to 100° C.

7. The film adhesive according to claim 2, wherein the 180° peel strength between the adhesive layer (B) and the adhesive layer (C) is from 0.1 N/25 mm to 2.5 N/25 mm.

8. The film adhesive according to claim 1, wherein the adhesive layer (C) comprises a resin composition containing a thermosetting resin and a filler as essential components in addition to the thermoplastic polyimide.

9. The film adhesive according to claim 8, wherein the polyimide is a polyimide obtained by reacting a diamine component containing a diamine having a chained polyether in a molecule with a tetracarboxylic dianhydride component.

10. The film adhesive according to claim 8, wherein the polyimide is a polyimide obtained by reacting a diamine component containing a diamine having at least one phenolic hydroxyl group in a molecule and a diamine having a chained polyether in a molecule with a tetracarboxylic dianhydride component, and having a glass transition temperature of from 40° C. to 100° C.

11. A semiconductor package manufactured by using the film adhesive as described in claim 1.

12. A semiconductor package manufactured by using the film adhesive as described in claim 5.

* * * * *